(12) United States Patent
Brown

(10) Patent No.: US 9,875,916 B2
(45) Date of Patent: Jan. 23, 2018

(54) METHOD OF STRIPPING PHOTORESIST ON A SINGLE SUBSTRATE SYSTEM

(71) Applicant: TOKYO ELECTRON LIMITED, Tokyo (JP)

(72) Inventor: Ian J Brown, Austin, TX (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 13/670,381

(22) Filed: Nov. 6, 2012

(65) Prior Publication Data

US 2014/0007902 A1    Jan. 9, 2014

Related U.S. Application Data

(60) Provisional application No. 61/669,663, filed on Jul. 9, 2012.

(51) Int. Cl.
  *H01L 21/67*    (2006.01)
  *H01L 21/02*    (2006.01)
  (Continued)

(52) U.S. Cl.
  CPC .......... *H01L 21/67057* (2013.01); *G03F 7/42* (2013.01); *H01L 21/02076* (2013.01);
  (Continued)

(58) Field of Classification Search
  None
  See application file for complete search history.

(56) References Cited

U.S. PATENT DOCUMENTS 3,900,337 A * 8/1975 Beck et al. ............... 134/3
5,269,850 A * 12/1993 Jackson ............... 134/2
(Continued)

FOREIGN PATENT DOCUMENTS

EP    1708252    10/2006
JP    2006229198 A    8/2006
(Continued)

OTHER PUBLICATIONS

Butterbaugh, FSI International Presentation at the Surface Preparation and Cleaning Conference in Austin, Texas on May 4, 2006.
(Continued)

*Primary Examiner* — Michael Kornakov
*Assistant Examiner* — Pradhuman Parihar
(74) *Attorney, Agent, or Firm* — Wood Herron & Evans LLP

(57) ABSTRACT

Provided is a method and system for stripping an ion implanted resist or performing a post-ash clean using a single substrate tool. Cleaning objectives and cleaning operating variables are selected for optimization. The first step immerses the substrate in a first treatment chemical, while concurrently irradiating the substrate with UV light, the process completed in a first process time, a first flow rate, and a first rotation speed of the substrate. The second step dispenses onto the substrate a second treatment chemical at a second temperature and a second composition, the second treatment chemical dispensed at a dispense temperature, and completed in a second process time and a second rotation speed. The two or more selected cleaning operating variables comprise UV wavelength, UV power, first concentration, first rotation speed, first flow rate, second process time, second rotation speed, percentage of residue removal, and dispense temperature.

23 Claims, 13 Drawing Sheets

(51) Int. Cl.
 *G03F 7/42* (2006.01)
 *H01L 21/311* (2006.01)
(52) U.S. Cl.
 CPC .... *H01L 21/6715* (2013.01); *H01L 21/67051* (2013.01); *H01L 21/67086* (2013.01); *H01L 21/31133* (2013.01); *H01L 21/67115* (2013.01)

(56) References Cited

U.S. PATENT DOCUMENTS

| | | | |
|---|---|---|---|
| 6,432,622 B1* | 8/2002 | Moon et al. | 430/331 |
| 6,503,693 B1* | 1/2003 | Mohondro et al. | 430/328 |
| 6,524,936 B2 | 2/2003 | Hallock et al. | |
| 6,696,228 B2 | 2/2004 | Muraoka et al. | |
| 2002/0151156 A1 | 10/2002 | Hallock et al. | |
| 2004/0076912 A1* | 4/2004 | Muraoka et al. | 430/329 |
| 2004/0203251 A1* | 10/2004 | Kawaguchi et al. | 438/727 |
| 2004/0244818 A1* | 12/2004 | Fury et al. | 134/2 |
| 2005/0158671 A1 | 7/2005 | Shimizu et al. | |
| 2005/0205115 A1* | 9/2005 | Okuyama | G03F 7/423 134/33 |
| 2007/0123052 A1* | 5/2007 | Kashkoush et al. | 438/725 |
| 2008/0160729 A1 | 7/2008 | Krueger et al. | |
| 2008/0176002 A1 | 7/2008 | Tsutsumi et al. | |
| 2009/0032188 A1* | 2/2009 | Tsuchiya | H01L 21/67028 156/345.23 |
| 2010/0018951 A1 | 1/2010 | Christenson et al. | |
| 2010/0029088 A1* | 2/2010 | Mayer et al. | 438/748 |
| 2010/0149476 A1* | 6/2010 | Kim et al. | 349/138 |
| 2010/0224215 A1* | 9/2010 | Mertens et al. | 134/6 |
| 2010/0239986 A1* | 9/2010 | Kaneyama et al. | 430/434 |
| 2011/0061679 A1* | 3/2011 | Elliott et al. | 134/1.1 |
| 2011/0226280 A1 | 9/2011 | Berry et al. | |
| 2011/0253176 A1* | 10/2011 | Saito | 134/26 |
| 2011/0259376 A1* | 10/2011 | Wagener et al. | 134/94.1 |
| 2012/0052687 A1* | 3/2012 | Raghavan et al. | 438/705 |
| 2012/0247505 A1 | 10/2012 | Brown et al. | |

FOREIGN PATENT DOCUMENTS

| | | |
|---|---|---|
| JP | 2009170554 A | 7/2009 |
| KR | 100806476 B1 | 2/2008 |
| WO | 2009087958 A1 | 7/2009 |

OTHER PUBLICATIONS

Govindarajan, PhD Thesis, Effect of pretreatment of high dose implanted resists by UV activated hydrogen peroxide solutions for their effective removal by conventional.
(Continued) sulfuric-peroxide mixtures, Department of Materials Science and Engineering, University of Arizona.
U.S. Appl. No. 13/414,55, filed Mar. 7, 2012, by Brown, I J.
U.S. Appl. No. 13/413,620, filed Mar. 6, 2012, by Brown, I J.
U.S. Appl. No. 13/413,620, filed Mar. 6, 2012, by Brown, I J published as US2012/0247505 on Oct. 4, 2012.
International Patent Application No. PCT/US2013/049760, "International Search Report," dated Sep. 24, 2014, International Filing Date Jul. 9, 2013.
International Patent Application No. PCT/US2013/049760, "Internationational Preliminary Report on Patentability," dated Jan. 13, 2015, International Filing Date Jul. 9, 2013.
Japan Patent Office, Office Action issued in corresponding JP Patent Application No. 2015-521750, dated Nov. 24, 2015, 10 pp., including English translation.
Japan Patent Office, Office Action issued in corresponding JP Patent Application No. 2015-521750, dated Jul. 12, 2016, 11 pp., including English translation.
Korean Intellectual Property Office, Office Action issued in corresponding Application No. 10-2015-7003337 dated Sep. 19, 2016, 7 pp., including English translation.

* cited by examiner

METHOD OF STRIPPING PHOTORESIST ON A SINGLE SUBSTRATE SYSTEM

CROSS-REFERENCE TO RELATED APPLICATIONS

Pursuant to 37 C.F.R. §1.78(a)(4), this application claims the benefit of and priority to prior filed Provisional Application Ser. No. 61/669,663, filed Jul. 9, 2012, which is expressly incorporated herein by reference.

FIELD

The present application generally relates to semiconductor processing and specifically to a cleaning process on a substrate using a first step of immersion in a first treatment chemical and concurrently irradiating the substrate with ultra-violet (UV) light and a second step using a wet clean process using a second treatment chemical.

RELATED ART

In semiconductor processing, control of generation and lifetime of active chemical species is important to optimize cleaning processes with respect to removal efficiency of desired material, process time, and selectivity to other materials present on the substrate. In aqueous and plasma chemistry, generation of radicals is a convenient way to generate highly reactive and targeted species to remove material. Radicals are generated by mixing of two or more chemicals, (e.g. sulfuric acid and hydrogen peroxide to form hydroxyl radicals) or by application of energy, for example, light, heat, electrical/magnetic force, electrochemical, or mechanical energy. Ion implanted photoresist is challenging to remove because a hard crust layer forms during the implant process on the photoresist. When a certain range of doses and energies are used to implant ions on the resist, these hard crust layers have to be removed using a plasma ashing step. There are two methods known to remove ion implanted resist at levels of $1e^{15}$ atoms/cm$^2$ and higher. The first method is a two-step process using oxidizing/reducing plasma ash and a 120-140° C. sulfuric and peroxide mixture (SPM) wet process to remove residual organics. The challenge with this process is oxidization of the silicon substrate leading to loss of dopant in subsequent wet cleans. The second method is an all wet removal approach using SPM chemistry.

The challenge with all wet process removal or wet benches is that the SPM has to be heated to temperatures approaching 250° C. to achieve the desired resist removal performance and at a removal rate that is practical for manufacturing. Wet benches typically operate with SPM temperatures up to 140° C. To reach SPM temperatures of 250° C., one-pass single substrate process tools are required. However, over time, the SPM loses its activity as the sulfuric acid is diluted by the continuous replenishment of hydrogen peroxide that is required to retain its cleaning activity. With SPM, the best cleaning performance is achieved above 90 wt % total acid in the SPM. SPM below 80 wt % total acid has very poor cleaning performance and a fresh batch of 98-96 wt % sulfuric acid is often used. Methods exist to remove the excess water from the recycled SPM or using electrolyzed sulfuric acid to extend the usage life of the sulfuric acid. Both methods significantly increase the complexity, capital cost, and operating costs of the resist strip process. Similar considerations are also applicable to cleaning of substrates after an ashing process.

There is a need for a stripping method and system that makes single substrate process tools competitive in terms of cost of ownership and higher reliability in addition to expanding the process window for the lowest concentration of the process chemicals that can be used to strip an ion implanted resist or clean or perform post-ash cleaning.

SUMMARY

Provided is a method and system for stripping an ion implanted resist or performing a post-ash clean using a single substrate tool. Cleaning objectives and cleaning operating variables are selected for optimization. The first step immerses the substrate in a first treatment chemical, while concurrently irradiating the substrate with UV light, the process completed in a first process time, a first flow rate, and a first rotation speed of the substrate. The second step dispenses onto the substrate a second treatment chemical at a second temperature and a second composition, the second treatment chemical dispensed at a dispense temperature, and completed in a second process time and performed while the substrate is in a second rotation speed. The two or more selected cleaning operating variables comprise UV wavelength, UV power, first rotation speed, first flow rate, second process time, second rotation speed, percentage of residue removal, and dispense temperature.

LIST OF FIGURES

Figure 5:
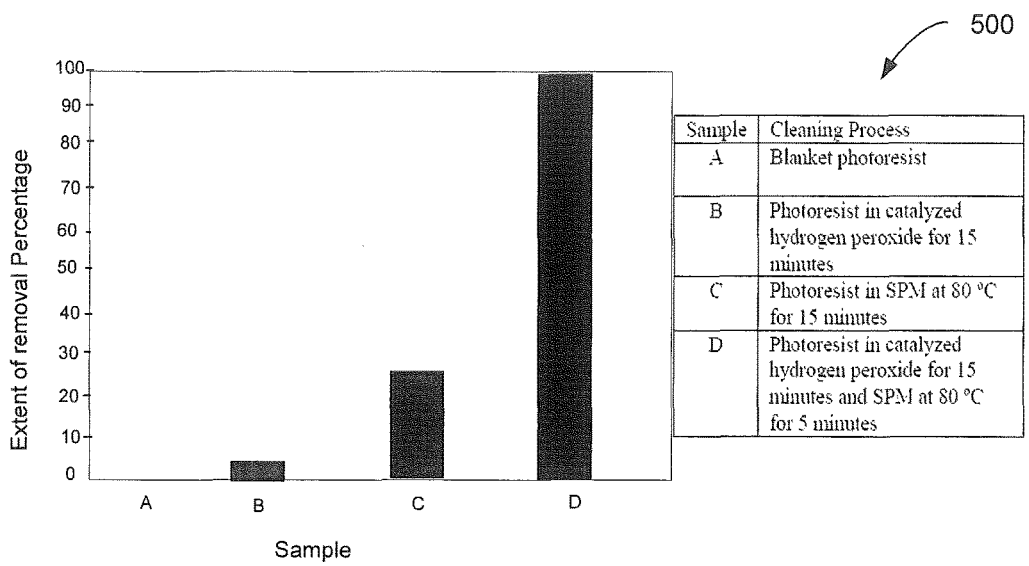

FIG. 5 depicts an exemplary prior art graph showing the extent of resist removal percentage for samples by varying UV dose and using a constant concentration of hydrogen peroxide. Refer to Govindarajan, PhD Thesis, "Effect of pretreatment of high dose implanted resists by UV activated hydrogen peroxide solutions for their effective removal by conventional sulfuric-peroxide mixtures", Department of Materials Science and Engineering, University of Arizona.

Figure 6:
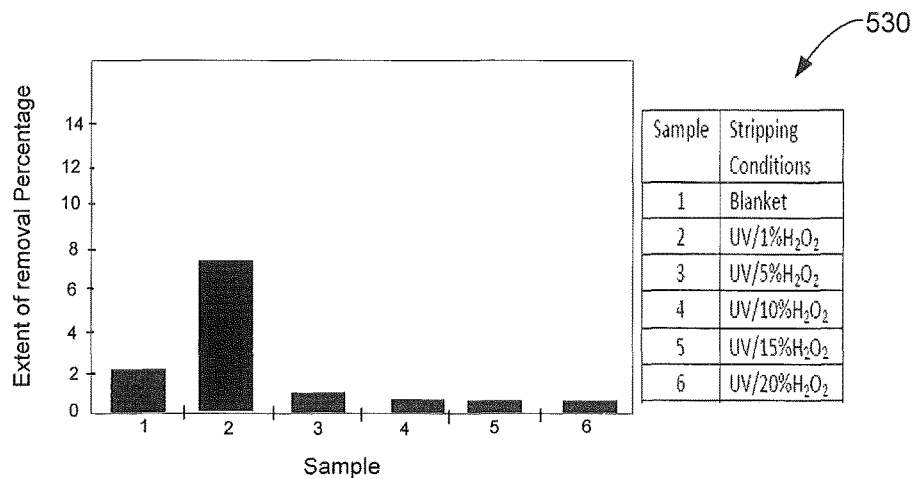

FIG. 6 depicts an exemplary graph showing the extent of resist removal percentage for samples with a constant UV dose and varying cleaning operating variables.

Figure 7:
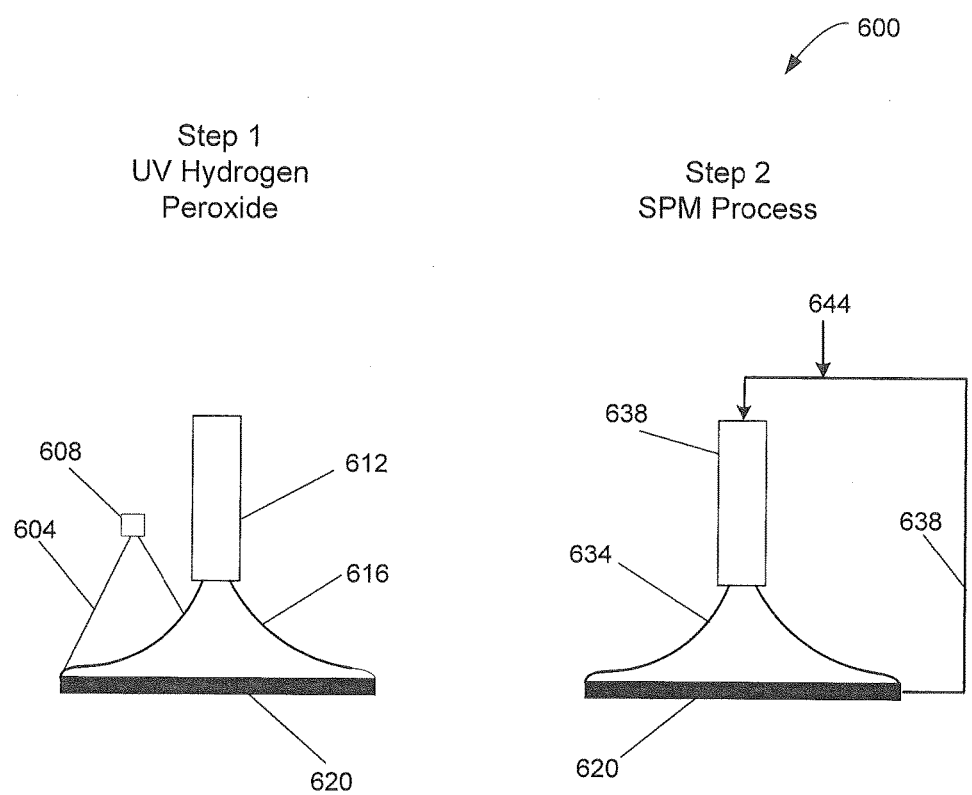

FIG. 7 depicts an exemplary architectural diagram of the two-step UV-peroxide (UVP) and sulfuric peroxide mixture (SPM) processes in an exemplary embodiment of the present invention.

Figure 8:
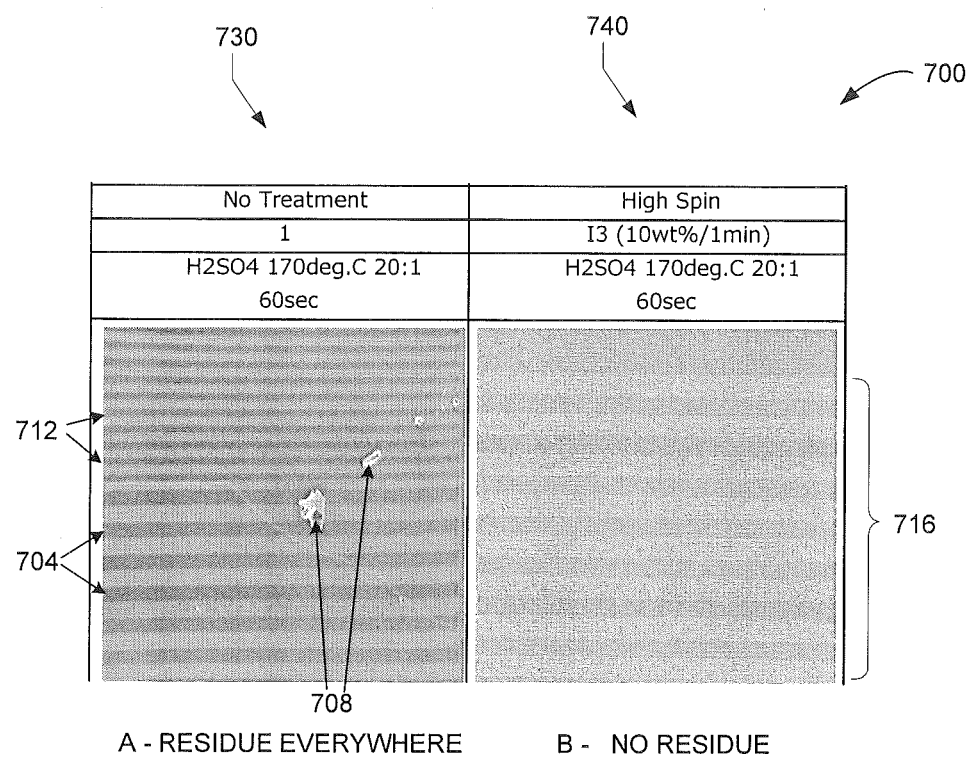

FIG. 8 depicts exemplary top-views of the results of cleaning using single step SPM-only, image A, versus a two-step UVP and SPM, image B, for removing $5E^{15}$ As atoms/cm$^2$ photoresist on a substrate.

Figure 9A:
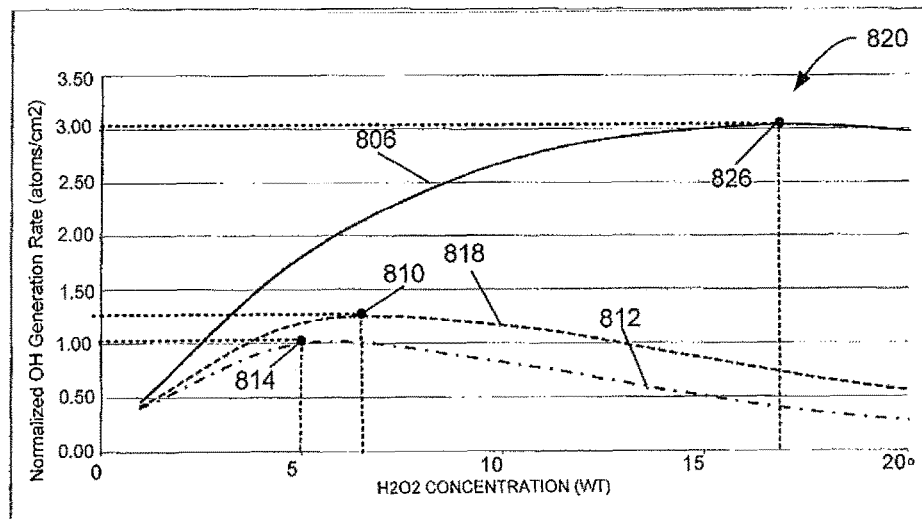

FIG. 9A is an exemplary normalized OH radical generation rate at the substrate surface as a function of $H_2O_2$ concentration and liquid film thickness close to the center of the substrate in an embodiment of the present invention.

Figure 9B:
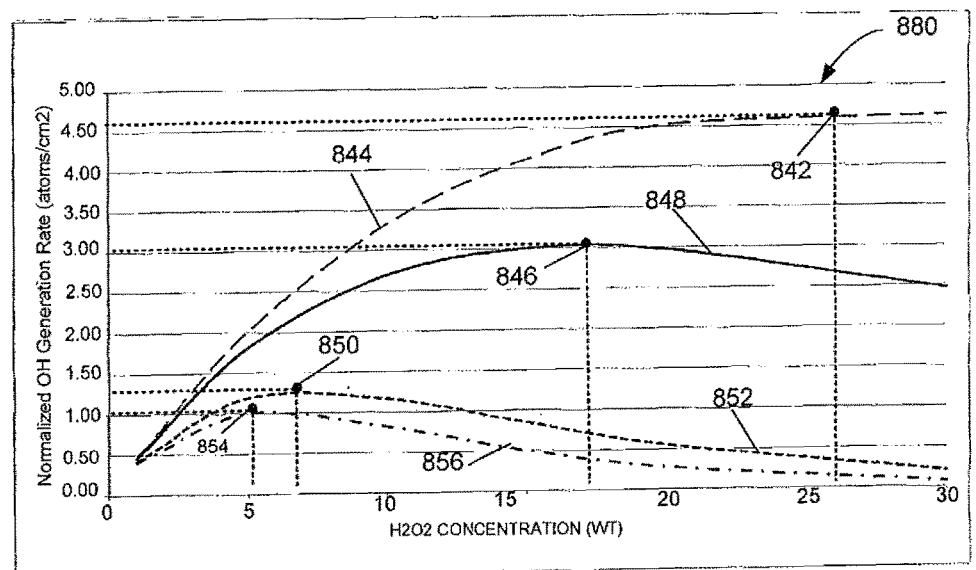

FIG. 9B is an exemplary normalized OH radical generation rate at the substrate surface as a function of $H_2O_2$ concentration and liquid film thickness close to the center and edge of the substrate in another embodiment of the present invention.

Figure 9C:
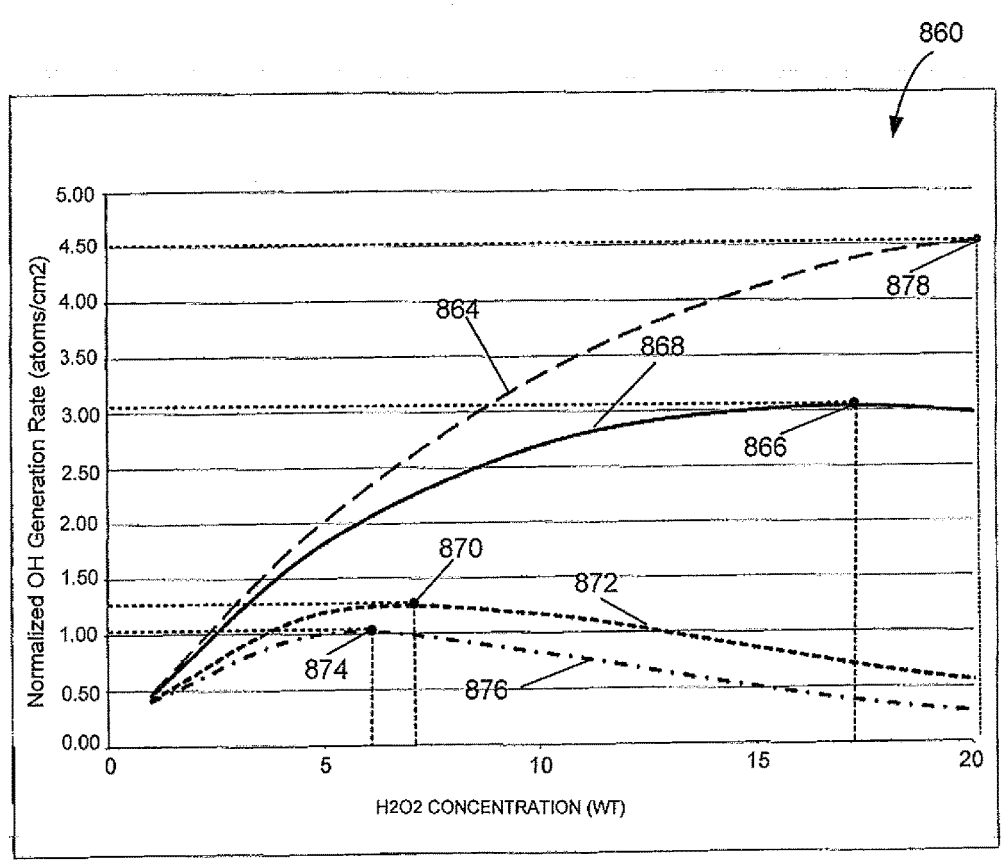

FIG. 9C is an exemplary normalized OH radical generation rate at the substrate surface as a function of $H_2O_2$ concentration and liquid film thickness close to the center and edge of the substrate in another embodiment of the present invention.

Figure 10A:
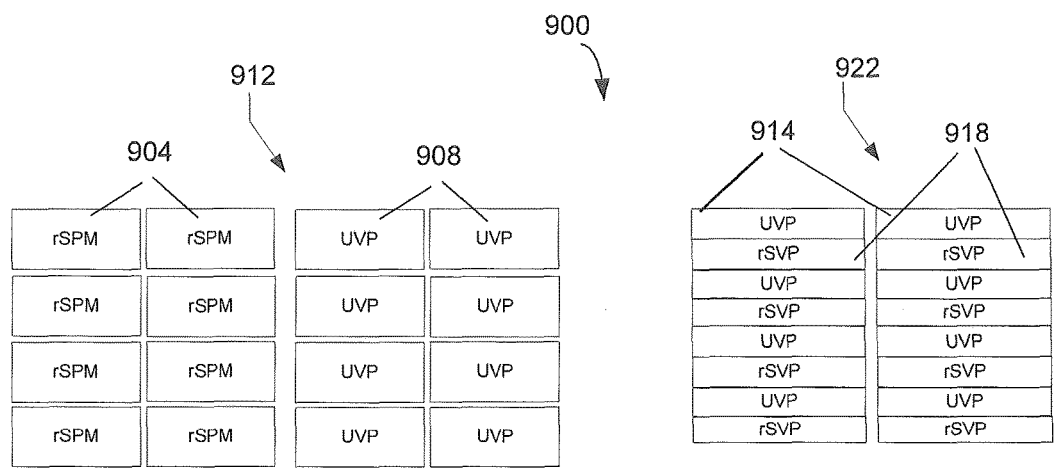

FIG. 10A is an exemplary diagram of a stack of dedicated spin chambers embodiment and an all-in-one spin chamber embodiment of the present invention.

Figure 10B:
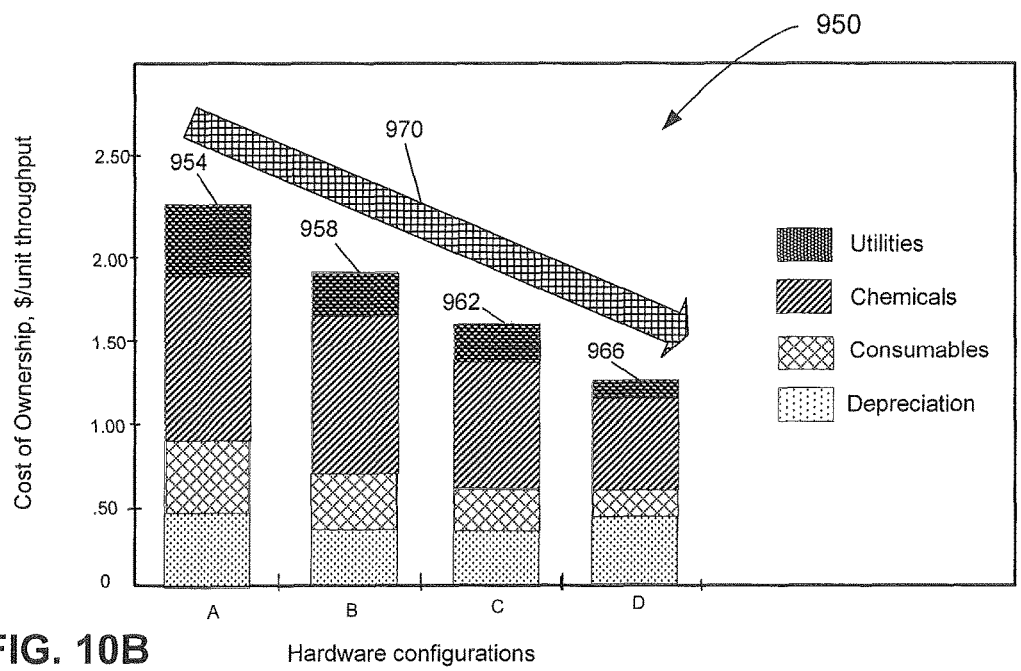

FIG. 10B is an exemplary graph of the different components of cost-of-ownership per unit throughput for different hardware configurations.

Figure 11:
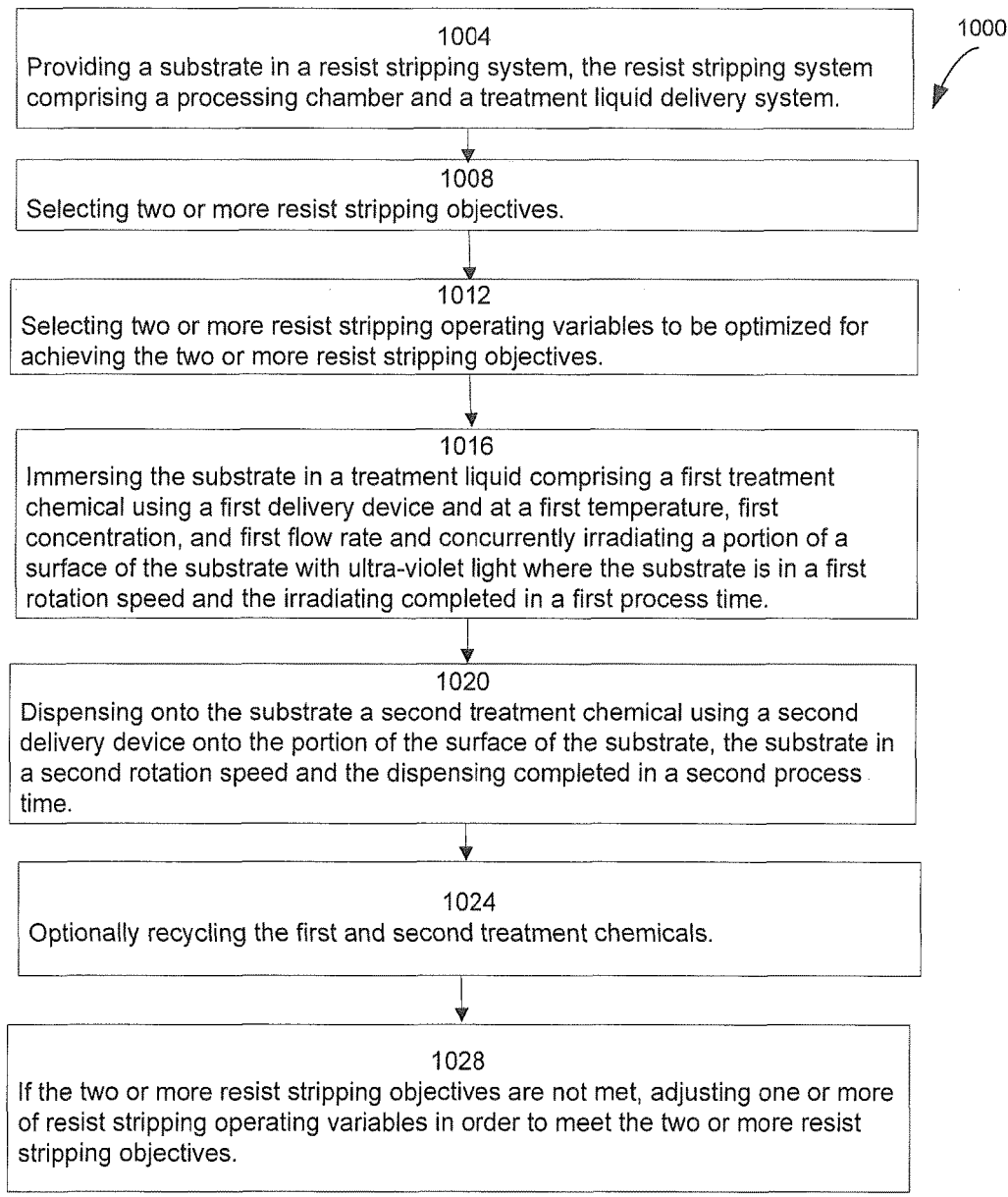

FIG. 11 is an exemplary method flowchart of an embodiment of the present invention.

Figure 12:
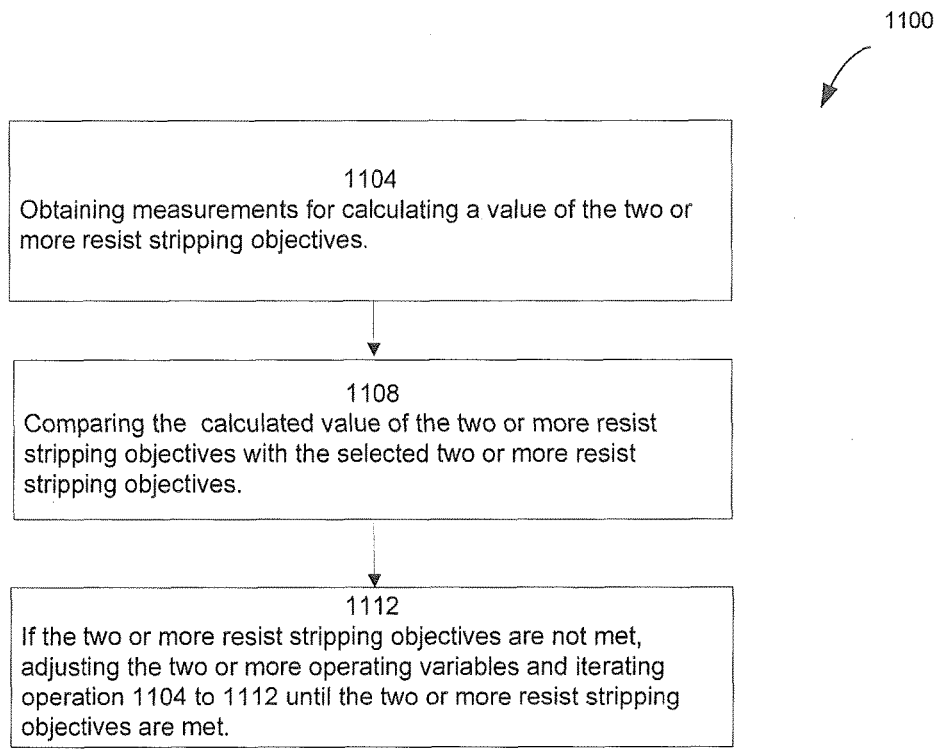

FIG. 12 is an exemplary flowchart of adjusting one or more treatment operating variables to meet the two or more objectives of the present invention.

Figure 13:
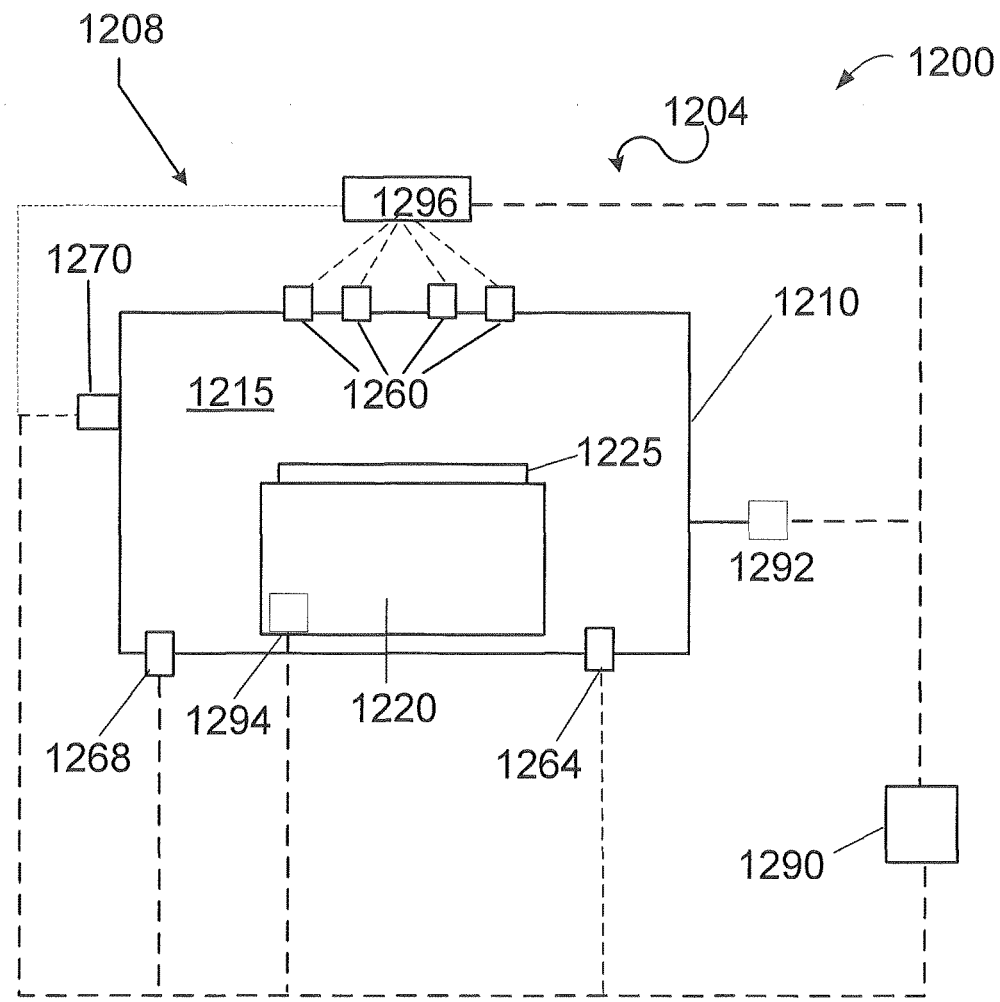

FIG. 13 is an exemplary architectural diagram of a single substrate resist treatment system in an embodiment of the invention utilizing optical and process metrology tools.

DETAILED DESCRIPTION OF EXEMPLARY EMBODIMENTS

Figure 1:
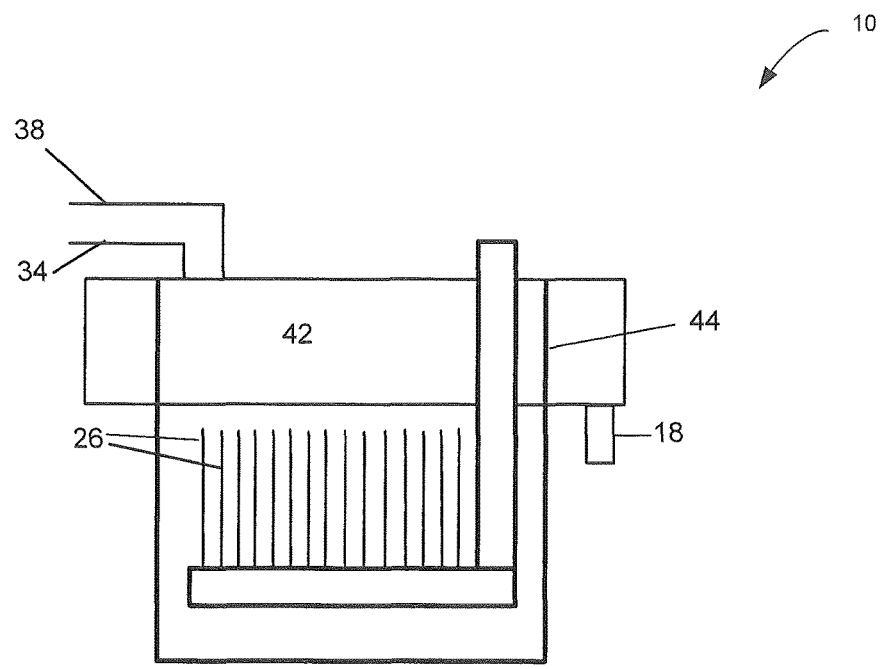
FIG. 1 is an architectural diagram illustrating a prior art method of cleaning in a batch etch process.

FIG. 1 is an architectural diagram illustrating a prior art method of cleaning in a batch etch process. In order to facilitate the description of the present invention, a semiconductor substrate is utilized to illustrate applications of the concept. The methods and processes equally apply to other workpieces such as a wafer, disk, memory or the like. Similarly, aqueous sulfuric acid and hydrogen peroxide mixture may be utilized to illustrate a treatment liquid in the present invention. As mentioned below, other treatment liquids can alternatively be used. The treatment liquid can include primary, secondary, and tertiary chemicals, one or more process gases, and reaction products. In this application, the invention is explained by using the example of stripping an ion-implanted resist and using SPM as the second treatment chemical. Other chemicals such as a sulfuric acid and ozone mixture (SOM) and the like can also be utilized. Furthermore, as stated above, the concepts and principles of the invention are equally applicable to cleaning of a substrate after an ashing process.

Referring to FIG. 1, an architectural diagram 10 illustrates a prior art method of surface treatment system such as cleaning in a batch etch process, where the etch chemicals (etchants) are dispensed using one or more input streams, 34 and 38, onto the etch processing chamber 44 where a plurality of substrates 26 are positioned. The etchants may be reused or recycled or disposed of using the overflow tank 42 and overflow spout 18. Heaters (not shown) can be provided, for example, by having heaters on the sides or at the bottom of the processing chamber 44. The heaters may be external or inline.

Figure 2A:
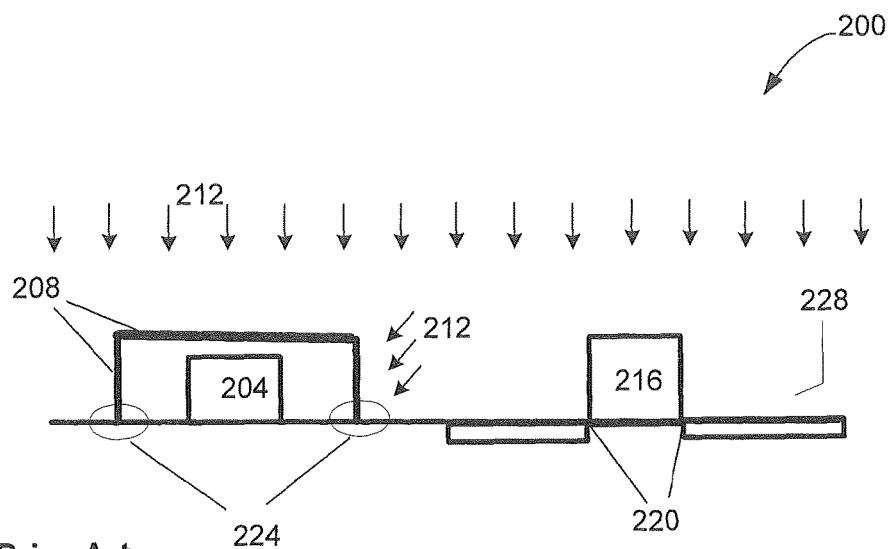
FIG. 2A depicts an exemplary prior art architectural diagram of the profile of a structure with crust fused to the substrate surface and near the edge bead region.
Figure 2B:
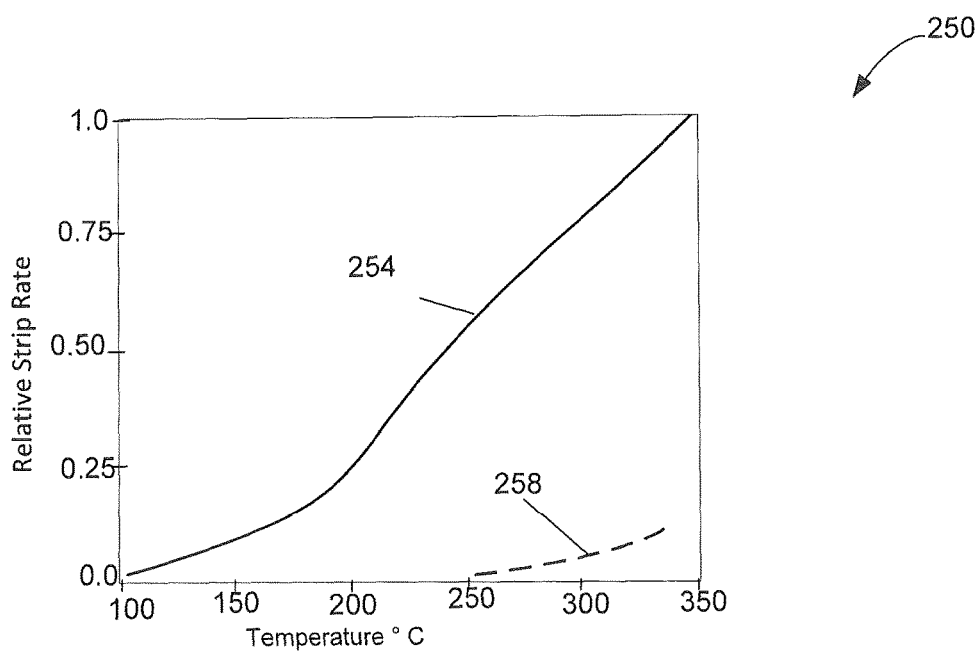
FIG. 2B depicts an exemplary prior art graph of relative strip rate as a function of temperature of the resist versus the carbonized layer. Refer to Butterbaugh Presentation on "ASH-FREE, WET STRIPPING OF HEAVILY IMPLANTED PHOTORESIST", FSI International, Surface Preparation and Cleaning Conference, Austin, Tex., on May 4, 2006.

FIG. 2A depicts an exemplary prior art architectural diagram 200 of the profile of a structure with a crust 208 fused to the surface, points 224, of a structure 204 in the substrate 228 and profile of an adjoining structure 216 without crust fused to the surface, points 220. The high dose ions 212 used in a previous process can cause development of the crust 208 that makes cleaning difficult. Formation of the crust 208 can be at the surface, points 224, of structure 204 in substrate 228 or near the edge bead region (not shown) of the substrate 228. Resist strip performance depends on the ion implant dose and energy. Effectiveness of a resist strip performance is correlated to the extent of removal percentage of the resist, speed of the process, and cost of ownership, which shall be discussed below. FIG. 2B depicts exemplary prior art graphs 250 of relative strip rate as a function of temperature of the resist compared to the temperature of the carbonized layer, such the crust 208 in FIG. 2A. The relative strip rate graph 254 for the resist has a greater up-slope as the temperature goes from 100° C. to 350° C. ending at 1.00 relative strip rate compared to the relative strip rate graph 258 of the carbonized layer at less than 0.20 relative strip rate at 340° C. Furthermore, the energy used in stripping the resist was much less, $E_a$=0.17 ev, compared to the energy used in stripping the carbonized layer, $E_a$=2.60 ev, with the carbonized layer having a much lower relative strip rate.

Figure 3:
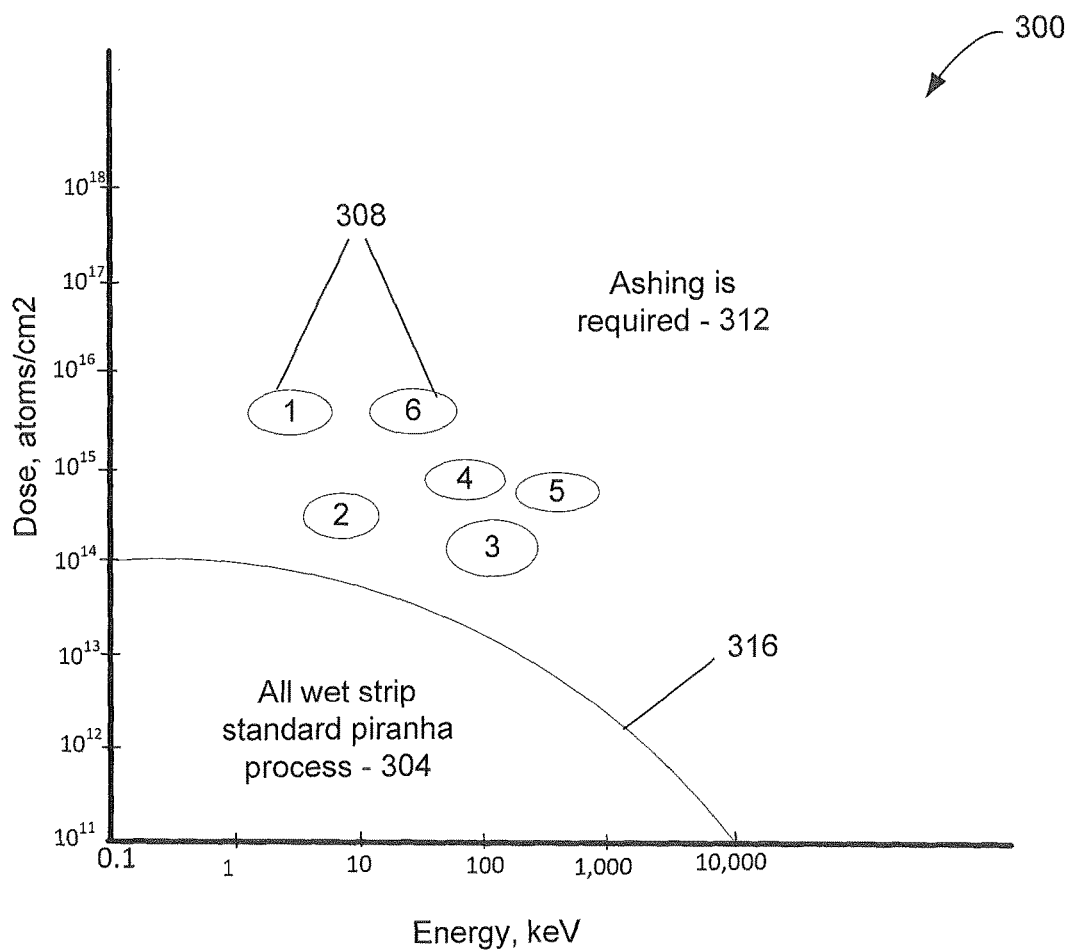
FIG. 3 depicts an exemplary prior art graph of ion implant dose as a function of energy required to strip the resist, highlighting where ashing is required. Refer to Butterbaugh Presentation on "ASH-FREE, WET STRIPPING OF HEAVILY IMPLANTED PHOTORESIST", FSI International, Surface Preparation and Cleaning Conference, Austin, Tex., on May 4, 2006.

FIG. 3 depicts an exemplary prior art graph 300 of ion implant dose as a function of energy required to perform the ion implant, highlighting where ashing is required 312. Below the curve 316 are strip processes 304 that can adequately be performed with a wet strip standard piranha process using sulfuric acid and hydrogen peroxide. Above the curve 316, certain resist processing can completely strip resists, while in others, ashing is required, 312. Ashing typically use a dry stripping process involving plasma using either microwave or radio frequency (RF) excitation. Dry stripping processes, such as ashing, typically have a higher cost of ownership than the standard piranha process. In graph 300, stripping process 2 (source-drain extension) and 3 (CMOS retrograde wells) may still be handled with the all wet standard piranha process. However, stripping process 1 (source drain contact) and 6 (polysilicon doping), group 308, require ashing to remove the ion implanted resist. Stripping processes 4 (preamorphization) and 5 (latch-up electrostatic discharge protection) either does or does not require ashing based on the substrate application. As mentioned above, ion implantation with a dose greater than $10^{15}$ atoms/cm$^2$ and energy level greater than 1,000 keV typically require ashing to remove the ion implanted resist.

Figure 4:
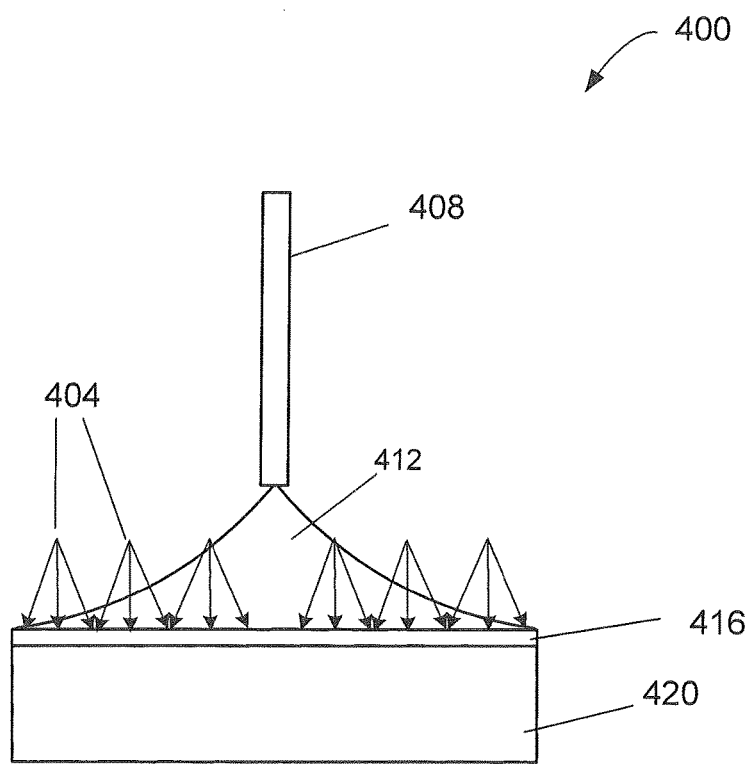
FIG. 4 depicts an exemplary prior art architectural diagram of a single substrate implementation of the first step of a UV peroxide process for stripping an ion implant resist layer.

FIG. 4 depicts an exemplary prior art architectural diagram 400 of a single substrate implementation of the first step of a UV peroxide process for stripping an ion implant resist layer. A dispense nozzle 408 is used to dispense hydrogen peroxide solution 412 onto a rotating substrate 420 where the substrate 420 has an ion implant resist layer 416 and the substrate 420 was immersed in the hydrogen peroxide solution 412. The UV lamp 404 directs the irradiation concurrently on the hydrogen peroxide solution 412. The second step comprises the use of a sulfuric peroxide mixture (SPM) to further remove the rest of the resist layer 416 not removed in the first step. Current art cleaning techniques generally use 254 nm UV lamps, the hydrogen peroxide solution 412 at 1 to 30 wt % at 25 to 60° C., and the SPM with a ratio of 2:1 sulfuric acid to hydrogen peroxide. The highest resist strip performance for current art was obtained with 5 wt % hydrogen peroxide solution in the first step and total of 15 minutes to complete the first and second steps.

FIG. 5 depicts an exemplary prior art graph 500 showing the extent of resist removal percentage for samples by varying the cleaning process, first process time, and second process time. In sample A, a blanket photoresist substrate is used as a control with zero extent of removal percentage. In sample B, the substrate is immersed in hydrogen peroxide with a catalyst, also referred to as catalyzed hydrogen peroxide, for 15 minutes in a first step with UV irradiation, generating about 5% extent of removal percentage of the resist. In sample C, the substrate is processed with an SPM wet process for 15 minutes, with the SPM at 80° C., generating about 26% extent of removal percentage of the resist. In sample D, the substrate is immersed in catalyzed hydrogen peroxide for 15 minutes in a first step with UV irradiation followed with an SPM wet process for 5 minutes, with the SPM at 80° C. in a second step, generating about 100% extent of removal percentage of the resist using a total of 20 minutes for the resist stripping process. For a detailed description of the above cleaning process, refer to U.S. Publication 20120052687 "ENHANCED STRIPPING OF IMPLANTED RESIST", Raghavan et al., published on Mar. 1, 2012.

The inventor conducted tests with the objective of getting a total process time which would make the single substrate cleaning implementation viable and competitive with other alternative processes in terms of speed and unit cost of ownership. Results from the conducted tests were used to generate subsequent graphs and develop the arrangement for the cleaning system depicted in FIG. 7. Referring to FIG. 6, depicted is an exemplary graph 530 showing the extent of resist removal percentage for samples with a constant UV dose and with varying concentrations of the hydrogen peroxide solution used to immerse the substrate, while concurrently irradiating the substrate with one or more UV lamps with a constant UV lamp power for a constant process time in the first step. In sample 1, the blanket substrate, a standard test substrate with blanket films, is used as control substrate where no removal of resist process is done, thus showing zero % extent of removal percentage. Sample 2 showed about 2.2% extent of removal percentage using 1% hydrogen peroxide concentration; in sample 3, the process showed 7.5% extent of removal percentage using 5% hydrogen peroxide concentration; in sample 4, the process showed about a 1.0% extent of removal percentage using a hydrogen peroxide concentration of 10%; in sample 5, the process showed 0.9% extent of removal percentage using a hydrogen peroxide concentration of 15%; and in sample 6, the process showed 0.7% extent of removal percentage using a hydrogen peroxide concentration of 20%. The extent of resist removal percentage does not have a linear correlation to hydrogen peroxide concentration.

From the various correlations of the stripping operating variables discussed above, the inventor found out that certain operating variables not previously emphasized in previous studies proved to be more advantageous towards meeting the goal of optimizing cleaning processes with respect to removal efficiency of desired material, process time, and selectivity to other materials present on the substrate. For example, an operating variable that was largely set to a fixed value based on the hardware setup for tests is the rotation speed of the substrate. Increasing the rotation speed from a range of 300 to 1,000 rpm or higher significantly improved the resist strip performance with the subsequent second step of processing the substrate with SPM. In addition, use of a higher concentration of hydrogen peroxide, for example, from 10 to 35 wt %, higher temperatures of the hydrogen peroxide used in the immersion process, higher temperature of the sulfuric acid in the SPM, for example, from 140 to 200° C., the SPM dispensed, for example, at a range of 140 to 160° C., when optimized concurrently yielded the best results in terms of improved resist strip performance.

In one test, the cleaning was performed with the first step (UV Peroxide Step) using 10 wt % hydrogen peroxide, one or more UV lamps at 222 nm wavelength, a first rotation speed of 500 rpm and a first process time of 1 minute immersing and concurrently irradiating the substrate with the one more UV lamps. The second step, the SPM process, was performed with an SPM using 20 parts sulfuric acid solution at 170° C. and 1 part hydrogen peroxide solution at 25° C. at a second rotation speed of 300 rpm, where the SPM was dispensed for about 60 seconds. Inspection of processed substrates showed a 100% success of cleaning using the first and second step approach as outlined above in about 2 minutes compared to previous complete cleaning requiring 15 minutes in previous trials.

FIG. 7 depicts an exemplary architectural diagram 600 of the two-step UV-peroxide (UVP) and sulfuric peroxide mixture (SPM) processes in an exemplary embodiment of the present invention. In Step 1 (first step), a substrate 620 having a resist layer is positioned in a processing chamber (not shown), the substrate rotating at a first rotation speed of 300 to 12,000 rpm, is immersed in 10 wt % $H_2O_2$, 616, from one or more nozzles 612. The immersed substrate 620 is concurrently irradiated with one or more UV lamps 608 where the UV light 604 generated is 254 nm. In the Step 2 (second step), a nozzle 638 is used to dispense SPM 634 having a ratio of about 20:1 of sulfuric acid to hydrogen peroxide where the SPM 634 is dispensed onto the substrate 620 at about 150° C., and the substrate 620 is in a second rotation speed of from 300 to 1,000 rpm. The SPM 634 can optionally be recirculated with a recycle subsystem 638 where new hydrogen peroxide can be introduced to maintain a target ratio of the sulfuric acid to hydrogen peroxide, at point 644.

FIG. 8 depicts exemplary top-views 700 of cleaning using SPM only (single step) versus UVP/$H_2O_2$ and SPM (two steps) for removing $5 \times 10^{15}$ As atoms/$cm^2$ photoresist on a substrate. Labeled as "A—Residue everywhere" is a top-view image of a portion of a substrate processed with a single step treatment of SPM where the sulfuric acid solution used in the SPM is dispensed at 150° C., SPM at a ratio of 20:1 sulfuric acid to hydrogen peroxide and dispensed on a portion of a surface of the substrate for 60 seconds. The image 730 shows a first set of lines and spaces of a repeating structure with a given critical dimension 704, and a second set of lines and spaces of a repeating structure 712, some of the lines being not straight, having different pitches, and the measurement area is littered with residue 708 of various sizes and shapes. Labeled as "B—No Residue" is a top-view image of a portion of a substrate processed with a two-step treatment of UVP/$H_2O_2$ and SPM where a higher spin or rotation rate was used, the hydrogen peroxide used to immerse the substrate was 10 wt % and UV irradiation was completed in 1 minute, and the sulfuric acid solution used in the SPM was 170° C., SPM at a ratio of 20:1 sulfuric acid to hydrogen peroxide and dispensed on a portion of a surface of the substrate for 60 seconds. The image 740 shows one set of lines and spaces having a uniform pitch, where the lines are straight and clearly defined, and the measurement area has no residue.

The next three figures, FIGS. 9A, 9B, and 9C depict the normalized hydroxyl (OH) generation rate as a function of hydrogen peroxide concentration at various rotation speeds of the substrate in the first step of the two-step cleaning process. FIG. 9A is an exemplary graph 820 of normalized OH radical generation rate at the substrate surface as a function of $H_2O_2$ concentration at the center of the substrate, where various graphs represent data collected at several first rotation speeds of the substrate. The graph 812 corresponding to a first rotation speed of the substrate, e.g. the UVP/$H_2O_2$ step, at 100 rpm shows the maximum normalized OH generation rate, point 814, at about 1.05 atoms/$cm^2$; graph 818 corresponding to a first rotation speed of the substrate at 1,000 rpm shows the maximum normalized OH generation rate, point 810, at about 1.30 atoms/$cm^2$; and graph 806 corresponding to a first rotation speed of the substrate at 3,000 rpm shows the maximum normalized OH generation rate, point 826 at about 3.10 atoms/$cm^2$. The highest normalized OH generation rate of 3.10 corresponds to a first rotation speed of 3,000 rpm and 17.5 wt % hydrogen peroxide.

FIG. 9B is an exemplary graph 880 of normalized OH radical generation rate at the substrate surface as a function of $H_2O_2$ concentration and liquid film thickness close to the center and the edge of the substrate. The graphs (856, 852, 848, and 844) corresponding to first rotation speeds of the substrate at 100, 1,000, 3,000 rpm and at the edge of the substrate are similar to graphs in FIG. 9A, with the exception of graph 844. For example, in graph 856 corresponding to a first rotation speed of the substrate at 100 rpm, the maximum normalized OH generation, point 854, is about 1.05 atoms/$cm^2$; graph 852 corresponding to a first rotation speed of 1,000 rpm, the maximum normalized OH generation, point 850, is about 1.25 atoms/$cm^2$ atom/$cm^2$; and graph 848, corresponding to a first rotation speed of 3,000 rpm, the maximum normalized OH generation, point 846, is about 3.05 atoms/$cm^2$ atom/$cm^2$. Referring to graph 844, the maximum normalized OH generation rate, point 842, is about 4.60 atoms/$cm^2$ and a 26.0 wt % hydrogen peroxide.

FIG. 9C is an exemplary graph 860 of normalized OH radical generation rate at the substrate surface as a function of $H_2O_2$ concentration and liquid film thickness close to the center and edge of the substrate. The graphs (876, 872, 868, and 864) corresponding to first rotation speeds of the substrate at 100, 1,000, 3,000 rpm, and at the edge of the substrate, respectively, are similar to graphs in FIG. 9B, with the exception of graph 864. For example, in graph 876 corresponding to a first rotation speed of the substrate at 100 rpm, the maximum normalized OH generation, point 874, is about 1.05 atoms/$cm^2$; graph 872 corresponding to a first rotation speed of 1,000 rpm, the maximum normalized OH generation, point 870, is about 1.25 atoms/$cm^2$; and graph 868, corresponding to a first rotation speed of 3,000 rpm, the maximum normalized OH generation, point 866, is about 3.05 atoms/$cm^2$ atom/$cm^2$. Referring to the edge of the substrate, graph 864, shows the highest maximum normalized OH generation rate, point 878, is about 4.50 atoms/$cm^2$ and $H_2O_2$ concentration of about 20 wt %.

FIG. 10A is an exemplary architectural diagram 900 of a stack of dedicated spin chambers 912 embodiment and an all-in-one spin chamber 922 embodiment of the present invention. The dedicated spin chambers 912 can be one or more stacks of UV-peroxide (UVP) chambers 908 where the substrate (not shown) is loaded, immersed in the hydrogen peroxide solution and concurrently irradiated with one or more UV light devices for a first process time at a first rotation speed of the substrate. Other oxidizers in addition to hydrogen peroxide can also be used. The substrates (not shown) are unloaded from the UVP chambers 908 and loaded onto the recycle SPM (rSPM) processing chamber 904 where the resist is treated with SPM for a second process time at a second rotation speed of the substrate. In another embodiment, the all-in-one spin chambers 922 can be one or more stacks of processing chambers each further comprising a UVP chamber 914 and an rSPM chamber 918. In an embodiment, the UVP chamber 914 and the rSPM chamber 918 can be a single processing chamber having one of more nozzles for dispensing the hydrogen peroxide solution and/or the SPM. Alternatively, different nozzles can be used for dispensing the hydrogen peroxide solution and the SPM. In other embodiments, acids other than sulfuric acid and oxidizers other than hydrogen peroxide can also be used.

FIG. 10B is an exemplary graph 950 of the different components of cost-of-ownership (COO) per unit throughput for different hardware configurations for resist strip processing. Hardware configuration A has a bar graph 954 showing utilities at the top, followed by cost of chemicals used for the resist strip, cost of consumables, for example, UV lamp replacements, and depreciation of capital equipment, totaling about $2.23 per unit of throughput, e.g., per substrate. Another hardware configuration B has a similar bar graph 958 with the same COO components totaling about $1.95 per substrate. In an exemplary embodiment of the present invention hardware configuration C using one-time chemicals and the same COO items as configuration A and B above is shown in bar graph 962 totaling about $1.60 per substrate, primarily due to less cost of utilities and chemicals. In another exemplary embodiment hardware configuration D of the present invention where the chemicals are recycled, with the same COO items as configuration A and B above, shown in bar graph 966 totaling about $1.20 per substrate primarily due to less cost of utilities, chemicals, and consumables with a slight increase in depreciation of equipment to account for the recycling equipment. The decrease in COO per unit throughput 970 shows a downward slope as various components of the COO are decreased. The decrease in COO for the two embodiments of the present invention was more than was expected by the inventor prior to the tests and was obtained by optimizing the two or more cleaning operating variables that will be covered in the discussion associated with FIGS. 11, 12, and 13.

FIG. 11 is an exemplary flowchart 1000 of an embodiment of the present invention in which a substrate resist stripping process is described. As mentioned above, the concepts and principles of the present invention are equally applicable to a substrate post ash cleaning process. In operation 1004, a substrate is provided in a resist stripping system where the resist stripping system comprises a processing chamber and a treatment liquid delivery system. The substrate with an ion implanted resist or a post ash substrate is provided as described in relation to FIG. 7 where an exemplary two-step UV-peroxide (UVP) and sulfuric peroxide mixture (SPM) processes are depicted. As mentioned in relation to FIG. 10A, the UVP system can be a stack of individual rSPM processing chambers and a stack of UVP processing chambers or a stack of combined rSPM and UVP processing chambers where automated loading and unloading of substrates can be utilized. In operation 1008, two or more resist stripping objectives, for example, COO per unit throughput and percentage of residue removal, are selected. The COO per unit throughput can be a range of $1.00 to $4.00. The percentage of residue removal can be a range from 90% to 100% or 95% or higher. Other resist stripping objectives can include first process time for the UVP process, a second process time for the rSPM process, and a total process time for the resist stripping, equal to the sum of the first process time and the second process time.

In operation 1012, two or more resist stripping operating variables are selected to be optimized in order to achieve the two or more resist stripping objectives. Resist stripping operating variables can include a first temperature, a first composition, a first flow rate of the first treatment chemical, a first process time, and a first rotation speed of the substrate, a first residue removal percentage, the UV wavelength, the UV power, a second temperature, a second composition, a second flow rate of the second treatment chemical, a second process time, and a second rotation speed of the substrate, a second residue removal percentage, total residue removal percentage, and dispense temperature of the second chemical. Other cleaning operating variables can also be added for optimization.

In operation 1016, the substrate in a first rotation speed is immersed in a first treatment chemical at a first temperature, first concentration, and first flow rate using a first delivery device. The first delivery device can include one or more nozzles. Concurrently, a UV light device, coupled to the processing chamber and configured to irradiate a portion of a surface of the substrate for a first process time where the UV light device generates UV light at a wavelength and UV power and where the substrate is rotated in a first rotation speed and the immersion and irradiation are completed in a first process time. The first treatment chemical can be an oxidizer, for example, hydrogen peroxide with a concentration from 10 to 35 wt %, a flow rate of 5 to 1,000 mL, or 5 to 70 mL, and a temperature of 25 to 90° C. The UV light device can have a wavelength from 187 to 300 nm, or 222 nm, such as the Ushio Excimer Lamp System, in 5440 Cerritos Ave., Cypress CA 90630. The substrate can have a rotation speed of 300 to 12,000 rpm or 500 rpm and the first process time can be in the range of 15 to 180 seconds.

In operation 1020, the second treatment chemical is dispensed using a second delivery device onto a portion of the surface of the substrate where the second treatment chemical can be SPM where the ratio of sulfuric acid to hydrogen peroxide can be in the range of 2:1 to 30:1, or 20:1; the sulfuric acid at about 170° C., the hydrogen peroxide at about 25° C., the substrate second rotation speed can be in the range of 300 to 12,000 rpm or 300 rpm and the second process time can be in the range of 15 to 180 seconds, the second treatment chemical can be dispensed in a range of 80 to 200° C., or at 160° C. or lower; and the second process time is in a range of 15 to 180 seconds. The second delivery device can include one or more nozzles. The sum of the first process time and the second process time is the total process time and can be in the range of 240 seconds or less. In operation 1024, the first and second treatment chemicals are optionally recycled. For certain applications, single use treatment chemicals can be required and thus not recycled. In an embodiment where the first treatment chemical is hydrogen peroxide and the second treatment chemical is SPM, these chemicals are not recycled. In another embodiment using two treatment chemicals, these can be recycled and the treatment liquid delivery system can be configured to add fresh first and second treatment chemicals and a recycle delivery subsystem can be added to handle the recycling. For a detailed description of recycling of treatment liquid for resist treatment systems, refer to U.S. application Ser. No. 13/414,554 "SEQUENTIAL STAGE MIXING FOR A RESIST BATCH STRIP PROCESS" by Brown, filed on Mar. 7, 2012 and to U.S. application Ser. No. 13/413,620 "SEQUENTIAL STAGE MIXING FOR SINGLE SUBSTRATE STRIP PROCESSING" by Brown, filed on Mar. 6, 2012 which are included in their entirety by reference herein.

In operation 1028, if the two or more cleaning objectives are not met, one or more of the selected operating variables are adjusted in order to meet the two or more cleaning objectives. FIG. 12 provides an exemplary flowchart 1100 for adjusting one or more treatment operating variables to meet the two or more objectives of the present invention. For example, assume that the two or more stripping objectives include percentage of residue removal at 98% or more and total process time of 120 seconds or less. Assume further that the two or more selected operating variables include first rotation speed of 100 to 5,000 rpm, concentration of the first treatment chemical, for example, hydrogen peroxide, is 15 to 30 wt %. Referring to FIG. 12, in operation 1104, measurements are obtained for calculating the percentage of residue removal and total process time. The measurements can include obtaining top view images of the substrates after the cleaning process to measure percentage of residue removal and recording the first process time and the second process time. In operation 1108, the calculated values of the two or more stripping objectives are compared to the 98% or more residue removal rate and the total process time of 120 seconds or less.

In operation 1112, if the two or more stripping objectives are not met, the two or more selected operating variables, in the above example, first rotation speed and concentration of the first treatment chemical, are adjusted until the two or more cleaning objectives are met. As mentioned above, tests showed that higher concentrations of hydrogen peroxide above 5 wt % and higher first rotation speeds of about 300 rpm and above generated better than expected results. Other operating variables included the use of about 222 nm UV light device, a first process time of about 60 seconds for the UVP step and use of SPM with 170° C. sulfuric acid mixed about 20 parts to 1 part hydrogen peroxide at 25° C. dispensed for about 60 seconds, the substrate at a second rotation speed of about 300 rpm. The dispense of the SPM onto the substrate can be performed at 150° C. or lower. The lower dispense temperature of the SPM is significant in reducing the silicon nitride loss. For more details in reducing silicon nitride loss, refer to U.S. application Ser. No. 13/076, 396 "ETCH SYSTEM AND METHOD FOR SINGLE SUBSTRATE PROCESSING", by Brown, filed on Mar. 30, 2011.

In one embodiment, three resist stripping operating variables including the first composition, first flow rate, and first rotation speed of the first treatment chemical can be selected. For example, the first composition can be hydrogen peroxide at 10 to 35 wt %, the first flow rate can be hydrogen peroxide at 5 to 1,000 mL/min, or 75 mL/min. The first rotation speed can be 300 to 12,000 rpm. Assuming 75 ml/min is selected for the first flow rate and complete wetting of the substrate cannot be achieved, the first flow rate can be adjusted so as to keep the aggregate flow rate of the first delivery device below 75 mL/min by adjusting the flow rates of the one or more nozzles. For example, the flow rate of the central nozzle, (located proximate to the center of the substrate) can be adjusted where a second or more nozzles dispense at a distance of 5 to 145 mm from the central nozzle to ensure complete wetting of the substrate. As mentioned above, the selected resist stripping operating variables are adjusted until the two or more stripping objectives are met.

The ability to strip high dose ion implanted resist at less than 140° C. and avoid the material loss challenges associated with plasma ashing or 250° C. SPM processing using one-pass SPM on a single substrate tool are made possible by optimizing the UVP and rSPM steps, using higher dose of hydrogen peroxide in UVP step, and higher first and second rotation speeds. In one embodiment, chemical usage is minimized because both dilute hydrogen peroxide and SPM can be used in recycle mode on the single substrate tool. The operations described in relation to FIGS. 11 and 12 yielded about 100% residue removal in the rSPM step with the total process time at about 120 seconds or less. Improving UV peroxide resist strip process was achieved by enabling use of higher concentrations of hydrogen peroxide under UV irradiation and by using higher single substrate rotation speeds. The inventor projects that further increases in the first and second rotation speeds from 1000 rpm to 12,000 rpm and higher and optimization of the two or more cleaning operating variables will provide further improvements in reducing the total process time and cost of ownership of the single substrate cleaning system using the concepts and principles of the present invention.

In order to describe the present invention to include stripping an ion implanted resist, substrate post ash clean, and similar cleaning applications, the terms "resist stripping objectives", "resist stripping operating variables", "stripping layer" and the like will be referred to in some claims as "cleaning objectives", "cleaning operating variables", "cleaning layer" and similar terms.

FIG. 13 is an exemplary architectural diagram 1200 of a single substrate resist treatment system in an embodiment of the invention utilizing optical and process metrology tools. The resist treatment system 1204 can use two or more optical metrology devices 1208. An optical emission spectroscopy (OES) device 1270 can be coupled to the processing chamber 1210 at a position to measure the optical emission from the processing region 1215. In addition, another set of optical metrology devices 1260 can be disposed atop the processing chamber 1210. Although four optical metrology devices 1260 are shown, many other alternative and different configurations of the optical metrology devices can be positioned to implement design objectives using a plurality of optical metrology devices. The four optical metrology devices 1260 can be spectroscopic reflectometric devices and/or interferometric devices. The measurements from the two or more optical metrology devices 1208, for example, the OES device 1270 and the set of optical metrology devices 1260, are transmitted to the metrology processor (not shown) where the critical dimension value is extracted. The measurement system 1208 can use one or more optical metrology devices 1208 and one or more residue sensor devices 1264 and 1268.

As mentioned above, a process sensor device, for example, a residue sensor device 1264 measuring the percentage of residue remaining, or a resist treatment operating variable with a substantial correlation to percentage of residue removal can be coupled to the processing chamber 1210. Selection of at least one or more process sensor devices can be done using multivariate analysis using sets of process data, metrology data (diffraction signals) and process performance data to identify these inter-relationships. The measurements from the two or more optical metrology devices, for example, the OES device 1270 and the set of optical metrology devices 1260 and the measurement from the sensor device 1264 and/or 1268 are transmitted to the metrology processor (not shown) where the operating variable values are extracted.

Still referring to FIG. 13, the resist treatment system 1204 includes a controller 1290 coupled to sub-controllers in the two or more optical metrology measurement devices 1208 comprising a plurality of optical metrology devices 1260, optical emission spectroscopy (OES) device 1270, and one or more etch sensor devices, 1264 and 1268. One or more chemical monitors 1292 can be coupled to the processing chamber to ensure the concentration of the first and second treatment chemicals are within the ranges set. Another sub-controller 1294 can be included in the motion control system 1220 that is coupled to the controller 1290 and can adjust the first and second rotation speeds provided by the motion control system 1220 for the UVP and rSPM steps. The controller 1290 can be connected to an intranet or via the Internet to other controllers in order to optimize the resist operating variables and in order to achieve the two or more cleaning objectives.

Although exemplary embodiments have been described, various modifications can be made without departing from the spirit and/or scope of the present invention. For example, the invention was illustrated and described utilizing stripping of a resist on a substrate. Other layers or structures on a substrate can be processed using the same methods and systems described in the specification. Furthermore, other acids and oxidizers and combination of treatment chemicals can also be used with the method and system described above. Therefore, the present invention should not be construed as being limited to the specific forms shown in the drawings and described above. Accordingly, all such modifications are intended to be included within the scope of this invention.

What is claimed:

1. A method for stripping a resist layer on a substrate using a resist stripping system, the resist stripping system comprising a processing chamber and a treatment delivery system, the treatment delivery system comprising a first delivery device and a second delivery device, the method comprising: providing a substrate in the resist stripping system, the substrate having an ion implanted resist layer; selecting three or more resist stripping objectives; selecting three or more resist stripping operating variables to be optimized concurrently for achieving the three or more resist stripping objectives; immersing the substrate in a hydrogen peroxide treatment liquid, the hydrogen peroxide treatment liquid at a first temperature, a first flow rate, and a first composition, the immersing performed with the first delivery device and concurrently irradiating a portion of a surface of the substrate with ultra-violet (UV) light, the UV light having a wavelength and having a UV power, the irradiating operationally configured to be completed in a first process time, the immersing and irradiating performed while the substrate is in a first rotation speed in a range from 3000 rpm to 12,000 rpm to increase and normalize hydroxyl generation rate; and dispensing onto the substrate a sulfuric acid peroxide mixture (SPM) using the second delivery device, the SPM at a second temperature, a second flow rate, and a second composition, the SPM dispensed onto a portion of a surface of the substrate at a dispense temperature, the dispensing operationally configured to be completed in a second process time and the dispensing performed while the substrate is in a second rotation speed; wherein the three or more resist stripping operating variables comprise the first rotation speed and two or more of the first temperature, the first composition, first flow rate, the UV wavelength, the UV power, the first process time, the second temperature, the second composition, the second process time, the second rotation speed, percentage of residue removal, and dispense temperature; wherein the layer to be cleaned is an ion implanted resist that formed a residue during an ion implantation process or wherein the substrate to be cleaned is a substrate after an ashing process, and wherein the three or more resist stripping objectives include cost of ownership, percentage of residue removal, a total process time, the total process time being the sum of the first process time and the second process time, and complete wetting of the substrate during operations of immersing the substrate in the hydrogen peroxide treatment liquid and operations of dispensing onto the substrate the SPM using the second delivery device, wherein the three or more resist stripping operating variables are optimized concurrently in order to yield optimal performance, and wherein a controller uses continuous measurement data from optical metrology measurement devices, sensor devices, and chemical monitors in order to achieve the three or more resist stripping objectives.

2. The method of claim 1 further comprising recycling the first treatment chemical and/or the second treatment chemical in order to maintain a ratio of the first treatment chemical to the second treatment chemical.

3. The method of claim 2 wherein the wavelength of the UV light is in a range of 172 to 300 nm.

4. The method of claim 3 wherein the first delivery device comprises one or more nozzles and is configured to achieve complete wetting of the substrate, wherein the hydrogen peroxide treatment liquid is in a range of 10 wt % to 35 wt %, and wherein the first flow rate is from 5 to 1,000 mL/min.

5. The method of claim 4 wherein if complete wetting of the substrate is not achieved with a first flow rate of 75 mL/min or below, setting a central nozzle of the one or more nozzles below 75 mL/min for a first flow rate and positioning one or more additional nozzles at between 5 to 145 mm from the central nozzle until complete wetting of the substrate is achieved.

6. The method of claim 4 further comprising:
obtaining measurements for calculating the three or more resist stripping objectives, generating three or more calculated resist stripping values;
comparing the three or more calculated resist stripping values to the three or more resist stripping objectives; and
if the three or more resist stripping objectives are not met, adjusting the selected three or more resist stripping operating variables or selecting a different three or more resist stripping operating variables and iterating the obtaining measurements, comparing the three or more calculated resist stripping values to the three or more resist stripping objectives, and adjusting the three or more selected operating variables until the three or more resist stripping objectives are met.

7. The method of claim 6 wherein the three or more resist stripping operating variables comprise the first rotation speed in the range from 3000 rpm to 12000 rpm and the second rotation speed in a range from 300 rpm to 1000 rpm.

8. The method of claim 1 wherein the three or more resist stripping operating variables comprise the first rotation speed in the range from 3000 rpm to 12000 rpm and the second rotation speed in a range from 300 rpm to 1000 rpm.

9. The method of claim 8 wherein the three or more resist stripping operating variables comprise the first composition in a range from 10 wt % to 35 wt % hydrogen peroxide.

10. The method of claim 3 wherein the percentage of residue removal is 95.0 percent or higher and the UV light is substantially 222 nm.

11. The method of claim 3 wherein the total time is 240 seconds or less.

12. The method of claim 3 wherein the first process time is in a range of 40 to 80 seconds and the second process time is in a range of 40 to 80 seconds.

13. The method of claim 3 wherein the first temperature is in a range of 28 to 90 degrees C. and the second temperature is in a range of 151 to 200 degrees C.

14. The method of claim 3 wherein the SPM comprises a mixture of sulfuric acid solution to hydrogen peroxide in a range from 11:1 to 30:1.

15. The method of claim 2 wherein the three or more resist stripping objectives comprise the percentage of residue removal and total process time.

16. The method of claim 2 wherein the three or more resist stripping objectives comprise cost of ownership per unit throughput, percentage of residue removal, and total process time.

17. The method of claim 2 wherein the resist stripping system comprises a stack of two or more ultra-violet peroxide (UVP) units and a stack of two or more recycle sulfuric acid peroxide mixture (rSPM) units.

18. The method of claim 2 wherein the resist stripping system comprises a stack of two or more stacks of all-in-one spin chambers each further comprising a combined ultra-violet peroxide (UVP) and recycle sulfuric acid peroxide mixture (rSPM) units.

19. The method of claim 2 wherein the first delivery device is the same as the second delivery device.

20. A method for stripping a resist layer on a substrate using a resist stripping system, the resist stripping system comprising a processing chamber and a treatment delivery system, the treatment delivery system comprising a first delivery device and a second delivery device, the method comprising: providing a substrate in the resist stripping system, the substrate having an ion implanted resist layer that formed a residue during an ion implantation process; selecting three or more resist stripping objectives; for a first process time and while rotating the substrate at a first rotation speed, immersing the substrate in a hydrogen peroxide solution using the first delivery device while concurrently irradiating a portion of a surface of the substrate with ultra-violet (UV) light to generate hydroxyl radicals for breaking through and stripping the residue and resist layer, the hydrogen peroxide solution being at a first temperature, a first flow rate, and a first composition, and the UV light having a wavelength and having a UV power; for a second process time and while rotating the substrate at a second rotation speed, dispensing onto the substrate a sulfuric acid peroxide mixture (SPM) using the second delivery device to further strip the residue and resist layer, the SPM at a second temperature, a second flow rate, and a second composition, the SPM dispensed onto a portion of a surface of the substrate at a dispense temperature; concurrently optimizing the first rotation speed, the second rotation speed, and the first composition for achieving the three or more resist stripping objectives, wherein the first rotation speed is optimized in a range from 3000 rpm to 12,000 rpm to increase and normalize hydroxyl generation rate, the second rotation speed is optimized in a range from 300 rpm to 1000 rpm, and the hydrogen peroxide solution is optimized in a range from 10 to 35 wt %.

21. The method of claim 20, further comprising concurrently optimizing one or more of the first temperature, the first flow rate, the UV wavelength, the UV power, the first process time, the second temperature, the second composition, the second process time, percentage of residue removal, or dispense temperature.

22. The method of claim 21, wherein the second composition is concurrently optimized to include a ratio of sulfuric acid to hydrogen peroxide in the SPM in a range from 11:1 to 30:1, and a temperature of the SPM in a range from 140 to 200 degrees C.

23. A method for stripping a resist layer on a substrate using a resist stripping system, the resist stripping system comprising a processing chamber and a treatment delivery system, the treatment delivery system comprising a first delivery device and a second delivery device, the method comprising: providing a substrate in the resist stripping system, the substrate having an ion implanted resist layer; selecting three or more resist stripping objectives; selecting three or more resist stripping operating variables to be optimized concurrently for achieving the three or more resist stripping objectives; immersing the substrate in a 26 to 35 wt % hydrogen peroxide solution at a first temperature, a first flow rate, and a first composition, the immersing performed with the first delivery device and concurrently irradiating a portion of a surface of the substrate with ultraviolet (UV) light, the UV light having a wavelength and having a UV power, the irradiating operationally configured to be completed in a first process time, the immersing and irradiating performed while the substrate is in a first rotation speed in a range from 3,000 rpm to 12,000 rpm to increase and normalize hydroxyl generation rate; dispensing onto the substrate a sulfuric acid peroxide mixture (SPM) using the second delivery device, the SPM at a second temperature in a range from 140 to 200 degrees C., a second flow rate, and a second composition in which a ratio of the sulfuric acid to hydrogen peroxide in the SPM is in a range from 11:1 to 30:1, the SPM dispensed onto a portion of a surface of the substrate at a dispense temperature, the dispensing operationally configured to be completed in a second process time and the dispensing performed while the substrate is in a second rotation speed in a range from 300 rpm to 1000 rpm; wherein the three or more resist stripping operating variables comprise the first rotation speed, the second rotation speed, and one or more of the first temperature, the first composition, first flow rate, the UV wavelength, the UV power, the first process time, the second temperature, the second composition, the second process time, percentage of residue removal, and dispense temperature; wherein the layer to be cleaned is an ion implanted resist that formed a residue during an ion implantation process or wherein the substrate to be cleaned is a substrate after an ashing process, and wherein the three or more resist stripping operating variables are optimized concurrently in order to yield optimal performance.

* * * * *

UNITED STATES PATENT AND TRADEMARK OFFICE
CERTIFICATE OF CORRECTION

PATENT NO.        : 9,875,916 B2
APPLICATION NO.   : 13/670381
DATED             : January 23, 2018
INVENTOR(S)       : Ian J. Brown It is certified that error appears in the above-identified patent and that said Letters Patent is hereby corrected as shown below:

On the Title Page

In Column 2, ABSTRACT, Line 1, "Provided is a method and system" should read --Provided are a method and system--.

In the Specification

In Column 2, Lines 1-2, "method and system that makes single substrate" should read --method and system that make single substrate--.

In Column 2, Line 10, "Provided is a method and system" should read --Provided are a method and system--.

In Column 4, Line 17, "such the crust 208" should read --such as the crust 208--.

In Column 4, Line 35, "typically use a dry stripping process" should read --typically uses a dry stripping process--.

In Column 4, Line 45, "either does or does not require" should read --either do or do not require--.

In Column 6, Line 11, "the one more" should read --the one or more--.

In Column 7, Line 31, "1.25 atoms/cm$^2$ atoms/cm$^2$; and graph" should read --1.25 atoms/cm$^2$; and graph--.

In Column 7, Line 34, "3.05 atoms/cm$^2$ atoms/cm$^2$." should read --3.05 atoms/cm$^2$.--.

In Column 7, Line 52, "3.05 atoms/cm$^2$ atoms/cm$^2$." should read --3.05 atoms/cm$^2$.--.

Signed and Sealed this
Fifteenth Day of May, 2018

Andrei Iancu
*Director of the United States Patent and Trademark Office*

CERTIFICATE OF CORRECTION (continued)
U.S. Pat. No. 9,875,916 B2

In the Claims

In Column 13, Line 34, Claim 6, "The method of claim 4 further comprising:" should read --The method of claim 3 further comprising:--.